(12) United States Patent
Determan

(10) Patent No.: US 7,728,660 B2
(45) Date of Patent: Jun. 1, 2010

(54) AUDIO SIGNAL PROCESSING SYSTEM AND METHOD

(75) Inventor: Michael Determan, Brighton, MA (US)

(73) Assignee: Sigmatel, Inc., Austin, TX (US)

( * ) Notice: Subject to any disclaimer, the term of this patent is extended or adjusted under 35 U.S.C. 154(b) by 109 days.

(21) Appl. No.: 12/194,435

(22) Filed: Aug. 19, 2008

(65) Prior Publication Data
US 2009/0091382 A1    Apr. 9, 2009

Related U.S. Application Data

(60) Provisional application No. 60/977,597, filed on Oct. 4, 2007.

(51) Int. Cl.
*H03F 3/38* (2006.01)
(52) U.S. Cl. .......................... 330/10; 330/127
(58) Field of Classification Search .................. 330/10, 330/251, 207, 127, 149; 381/120
See application file for complete search history.

(56) References Cited

U.S. PATENT DOCUMENTS 5,559,467 A    9/1996    Smedley 6,531,917 B2*   3/2003   Yamamoto et al. .......... 330/149
2003/0058148 A1*   3/2003   Sheen ........................ 341/155

* cited by examiner

*Primary Examiner*—Robert Pascal
*Assistant Examiner*—Khiem D Nguyen
(74) *Attorney, Agent, or Firm*—Toler Law Group

(57) ABSTRACT

An audio signal processing system and method is disclosed. In a particular embodiment, the audio signal processing system includes a first electrical path responsive to a power supply of an audio amplifier. The first electrical path can include a low pass filter to filter a direct current (DC) component of the power supply and a first analog-to-digital converter (ADC) responsive to the low pass filter. The audio signal processing system also includes a second electrical path responsive to the power supply. The second electrical path can include a high pass filter to filter an alternating current (AC) component of the power supply and a second ADC responsive to an output of the high pass filter. The audio signal processing system includes compensation logic to modify an audio signal based on a first signal generated from the first electrical path and a second signal generated from the second electrical path.

24 Claims, 3 Drawing Sheets

AUDIO SIGNAL PROCESSING SYSTEM AND METHOD

CLAIM OF PRIORITY

This application is a non-provisional application that claims priority from U.S. Provisional Patent Application No. 60/977,597, filed on Oct. 4, 2007 and entitled "AUDIO SIGNAL PROCESSING SYSTEM AND METHOD," which is incorporated herein by reference in its entirety.

FIELD OF THE DISCLOSURE

The present disclosure is generally related to systems and methods of processing audio signals.

BACKGROUND

Unregulated power supplies can exhibit fluctuations in the power provided to electronic devices such as amplifiers. These power fluctuations can distort an audio signal output of an amplifier powered by an unregulated power supply. Hence, there is a need for an improved audio signal processing system and method.

DETAILED DESCRIPTION OF THE DRAWINGS

Figure 1:
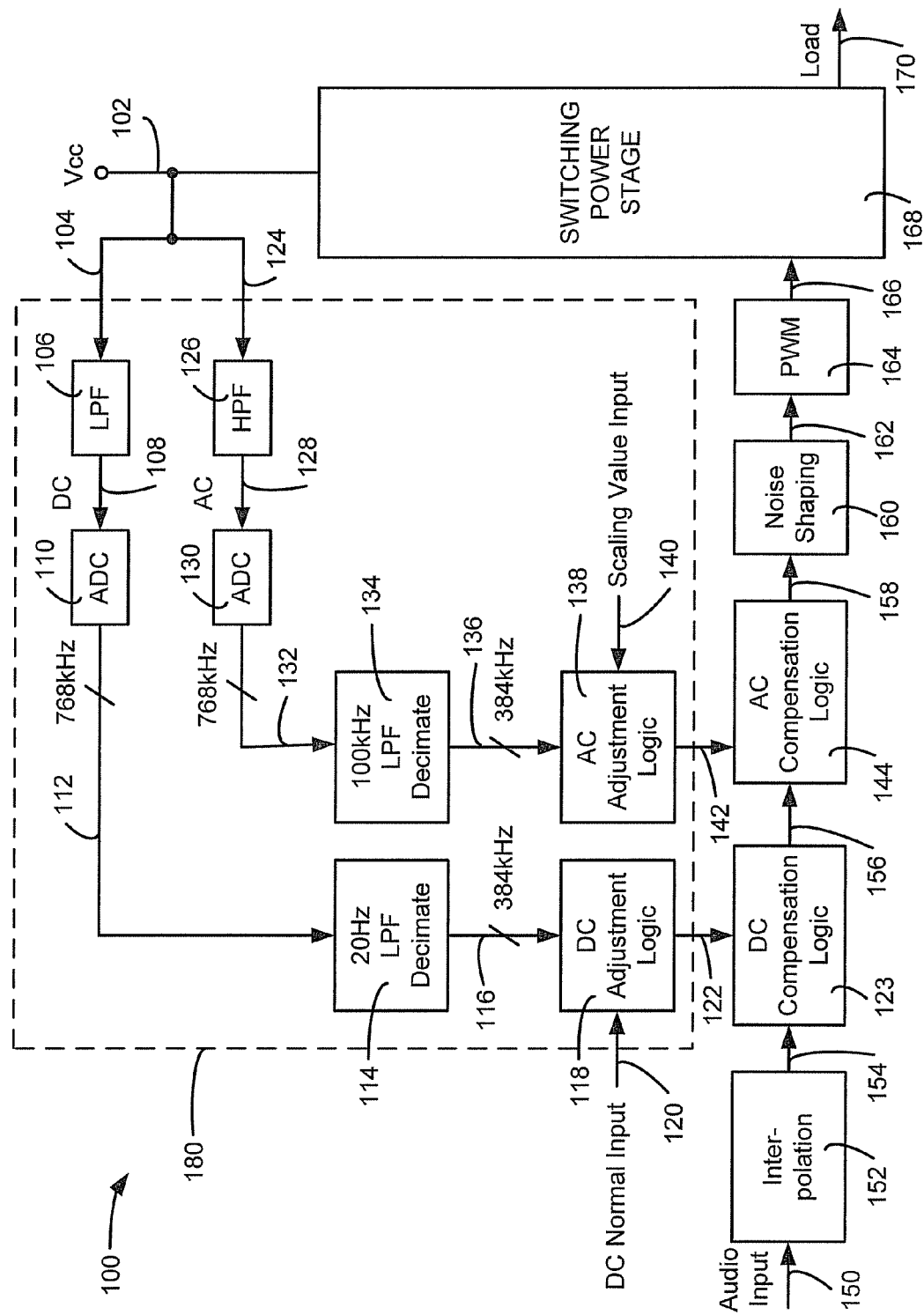
FIG. 1 is a block diagram of a particular illustrative embodiment of an audio signal processing system.

In a particular embodiment, an audio signal processing system for use in connection with a power supply of an audio amplifier is disclosed. The system includes a first electrical path responsive to the power supply. The first electrical path includes a low pass filter coupled to the power supply to filter a direct current (DC) component of the power supply. The power supply provides power to a power stage of the audio amplifier. The first electrical path also includes a first analog-to-digital converter (ADC) responsive to an output of the low pass filter. The system also includes a second electrical path responsive to the power supply. The second electrical path includes a high pass filter coupled to the power supply to filter an alternating current (AC) component of the power supply and a second ADC responsive to an output of the high pass filter. The system also includes compensation logic operable to modify an audio signal based on a first signal generated from the first electrical path and a second signal generated from the second electrical path.

In another embodiment, an audio amplifying device is disclosed that includes a power stage having a power supply input. The audio amplifying device also includes a low pass filter coupled to the power supply input to generate a direct current (DC) component of the power supply input. The audio amplifying device further includes a high pass filter coupled to the power supply input to generate an alternating current (AC) component of the power supply input. The audio amplifying device includes a first analog-to-digital converter (ADC) coupled to an output of the low pass filter and a second ADC coupled to an output of the high pass filter. The audio amplifying device includes first logic coupled to an output of the first ADC and operable to modify an audio signal based on the output of the first ADC to generate a first compensated signal. The audio amplifying device includes second logic coupled to an output of the second ADC that is operable to modify the first compensated signal based on the output of the second ADC.

In another embodiment, a method of processing an audio signal is disclosed. The method includes receiving a power signal from a power supply and dividing the power signal into an analog direct current (DC) component and an analog alternating current (AC) component. The method includes converting the analog DC component to a digital DC signal and converting the analog AC component to a digital AC signal. The method further includes modifying the audio signal based on at least the digital DC signal and the digital AC signal.

In another embodiment, a method is disclosed that includes receiving a power supply signal from a power supply of a power amplifier and filtering the power supply signal into an analog direct current (DC) signal and an analog alternating current (AC) signal. The method includes converting the analog DC signal to a digital DC signal and converting the analog AC signal to a digital AC signal. The method includes adjusting an audio signal based on at least the digital DC signal and the digital AC signal to generate an adjusted audio signal. The method further includes pulse-width modulating the adjusted audio signal to produce a pulse-width modulated audio signal and driving a switching power stage with the pulse-width modulated signal.

Referring to FIG. 1, a particular illustrative embodiment of an audio signal processing system is depicted and generally designated 100. The system 100 includes a device 180 that receives a first power signal input 104 from a power supply (Vcc) 102 and receives a second power signal input 124 from the power supply 102. The device 180 operates as a voltage correction circuit that generates an adjusted direct current (DC) signal output 122 based on the first input signal 104 and separates an adjusted alternating current (AC) signal output 142 based on the second input signal 124.

During operation, the system 100 receives an audio input signal 150 at an interpolating circuit 152 that generates an interpolated signal output 154. DC compensation logic 123 modifies the interpolated signal 154 based on the adjusted DC signal 122 to generate a first compensated signal output 156. AC compensation logic 144 modifies the first compensated signal output 156 based on the adjusted AC signal 142 to generate a second compensated signal output 158. A noise shaping circuit 160 receives the second compensated signal output 158 and provides a noise-shaped output signal 162 to a pulse-width modulator (PWM) 164. A power stage 168 that is coupled to the power supply 102 receives a pulse-width modulated output 166 of the PWM 164 and provides a power output signal 170 to a load.

In a particular embodiment, the device 180 includes a first electrical path that generates the adjusted DC signal 122 based on the first power signal input 104 and a second electrical path that generates the adjusted AC signal 142 based on the second power signal input 124. The first electrical path includes a low-pass filter (LPF) 106 that filters the first power signal input 104 and provides an analog DC signal output 108. The LPF 106 can operate to filter frequencies above a first predetermined frequency. In a particular embodiment, the first predetermined frequency is below an audio frequency range. In a specific embodiment, the first predetermined frequency can be between approximately 10 Hz and approximately 20 Hz.

In a particular embodiment, a first analog-to-digital converter (ADC) 110 can receive the analog DC signal 108 and generate a digital DC signal output 112. Because the first ADC 110 only receives a DC component of the power input signal 104, the first ADC 110 can have a lower precision, and thus be less expensive, than if the first ADC 110 operated on the unfiltered power input signal 104. In a specific embodiment, the first ADC 110 can be a high-speed successive approximation register (SAR) ADC. In a specific embodiment, the analog DC signal 108 can be scaled prior to being received at the first ADC 110 to improve a resolution of the first ADC 110. In a particular embodiment, a sample rate of the first ADC 110 can be a power-of-two multiple or sub-multiple of an output rate of the PWM 164. In a specific embodiment, the output rate of the PWM can be approximately 384 KHz and the sample rate of the first ADC 110 can be approximately 768 kHz.

In a particular embodiment, the digital DC signal 112 output of the first ADC 110 is input to a first digital decimation LPF 114. The first digital decimation LPF 114 can filter and decimate the digital DC signal 112 to generate a filtered DC signal output 116. In a particular embodiment, the first digital decimation LPF 114 can reject noise introduced into the digital DC signal 112 by the first ADC 110. In a specific embodiment, the first digital decimation LPF 114 rejects frequencies above approximately 20 Hz. In a particular embodiment, the filtered DC signal 116 can have a sample rate approximately equal to an output rate of the PWM 164. In a specific embodiment, the output rate of the PWM 164 and the sample rate of the filtered DC signal 116 can each be approximately 384 kHz.

In a particular embodiment, DC adjustment logic 118 can combine the filtered DC signal 116 and a DC Normal signal input 120 to generate the adjusted DC signal output 122 of the device 180. The DC Normal signal can represent a DC value that does not require modification of the audio signal 150. In a specific embodiment, the DC adjustment logic 118 can invert the filtered DC signal 116 using a recursive operation and can multiply the inverted signal with the DC Normal input signal 120 to generate the adjusted DC signal output 122.

In a particular embodiment, the DC Normal signal can include a reference signal that is at least partially determined by a decibel (dB) level of correction for the power supply 102. In a particular embodiment, the DC adjustment logic 118 can use the reference signal 120 to generate an adjusted DC signal 122 that causes the DC compensation logic 123 to attenuate the output 154 of the interpolating circuit 152. In another particular embodiment, the DC adjustment logic 118 can use the reference signal 120 to generate an adjusted DC signal 122 that causes the DC compensation logic 123 to apply a gain to the output 154 of the interpolating circuit 152.

In a particular embodiment, the second electrical path of the device 180 generates the adjusted AC signal 142 based on the second power signal input 124. The second electrical path includes a high-pass filter (HPF) 126 that filters the second power signal input 124 and provides an analog AC signal output 128. The HPF 106 can operate to filter frequencies below a second predetermined frequency. In a particular embodiment, the second predetermined frequency is below an audio frequency range. In a specific embodiment, the second predetermined frequency can be between approximately 10 Hz and approximately 20 Hz. In a particular embodiment, the first predetermined frequency of the LPF 106 and the second predetermined frequency of the HPF 126 can be approximately equal so that the LPF 106 and the HPF 126 form a crossover. In a specific embodiment, the LPF 106 and the HPF 126 can form a crossover that operates at approximately 10 Hz to 20 Hz.

In a particular embodiment, a second analog-to-digital converter (ADC) 130 receives the analog AC signal 128 and generates a digital AC signal output 132. Because the second ADC 130 only receives an AC component of the power input signal 124, the second ADC 130 can have a lower precision, and thus be less expensive, than if the second ADC 130 operated on the unfiltered power input signal 124. In a specific embodiment, the second ADC 130 can be a high-speed SAR ADC. In a specific embodiment, the analog AC signal 128 can be scaled prior to being received at the second ADC 130 to improve a resolution of the second ADC 130. In a particular embodiment, a sample rate of the second ADC 130 can be a power-of-two multiple or sub-multiple of an output rate of the PWM 164. In a specific embodiment, the output rate of the PWM 164 can be approximately 384 KHz and the sample rate of the second ADC 130 can be approximately 768 kHz.

In a particular embodiment, the digital AC signal output 132 of the second ADC 130 can be input to a second digital decimation LPF 134. The second digital decimation LPF 134 can filter and decimate the digital AC signal 132 to generate a filtered AC signal output 136. In a particular embodiment, the second digital decimation LPF 134 can limit a bandwidth of the filtered AC signal 136 to remove AC frequencies at the PWM 164 frequency and at other frequencies above an audio frequency band, and can provide for anti-aliasing. By limiting the bandwidth of the digital AC signal 132, the second digital decimation LPF 134 can reduce a total power of noise introduced by the second ADC 130, and can effectively raise the resolution of the filtered AC signal output 136. However, reducing the bandwidth of the digital AC signal 132 can also introduce an increased propagation delay, which can decrease an effectiveness of the system 100 at compensating for variations at the power supply 102. In a specific embodiment, the second digital decimation LPF 134 rejects frequencies above approximately 100 kHz. In a particular embodiment, the filtered AC signal 136 can have a sample rate approximately equal to an output rate of the PWM 164. In a specific embodiment, the output rate of the PWM 164 and the sample rate of the filtered AC signal 136 can each be approximately 384 kHz.

In a particular embodiment, AC adjustment logic 138 can receive the filtered AC signal 136 and a scaling value signal input 140 to generate the adjusted AC signal output 142 of the device 180. In a particular embodiment, the AC adjustment logic 138 can generate the adjusted AC signal 142 based on multiplying the scaling value signal 140 with the filtered AC signal 136. In a specific embodiment, the AC adjustment logic 138 can subtract a computed offset factor from the filtered AC signal 136 to generate the adjusted AC signal 142. The computed offset factor can be a multiplicative product of the scaling value signal 140, the filtered AC signal 136, and the adjusted filtered AC signal 136 that is adjusted by a predetermined adjustment value.

In a particular embodiment, the DC compensation logic 123 can modify the digital signal 154 received from the interpolating logic 152 based on the adjusted DC signal 122 to generate the first compensated signal output 156. The DC compensation logic 123 can modify the digital signal 154 to at least partially compensate for distortion that can occur to the audio signal at the power stage 168 due to low-frequency errors of the power supply 102. In a specific embodiment, the DC compensation logic 123 multiplies the digital signal 154 and the adjusted DC signal 122 to generate the first compensated signal 156.

In a particular embodiment, the AC compensation logic 144 can modify the first compensated signal 156 based on the adjusted AC signal 142 to generate the second compensated output signal 158. The AC compensation logic 144 can modify the first compensated signal 156 to at least partially compensate for distortion that can occur to the audio signal at the power stage 168 due to audio-range errors of the power supply 102. In a specific embodiment, the AC compensation logic 144 multiplies the first compensated signal 156 and the adjusted AC signal 142 to generate the second compensated signal 158. The second compensated signal 158 can be processed at the noise-shaping circuit 160 and then pulse-width modulated at the PWM 164 prior to input at the power stage 168.

In a particular embodiment, the power stage 168 can be a switching power stage that introduces distortion to the input signal 166 due to errors at the power supply 102. In a specific embodiment, the power stage 168 can have a full-bridge configuration. In another specific embodiment, the power stage 168 can have a half-bridge configuration. In yet another particular embodiment, the power supply 102 can be an unregulated power supply that exhibits AC errors such as a ripple and DC errors such as a DC offset. By modifying the audio signal via the DC compensation logic 123 and the AC compensation logic 144 for distortion, the power output of the power stage 168 can exhibit reduced distortion from errors of the power supply 102.

Figure 2:
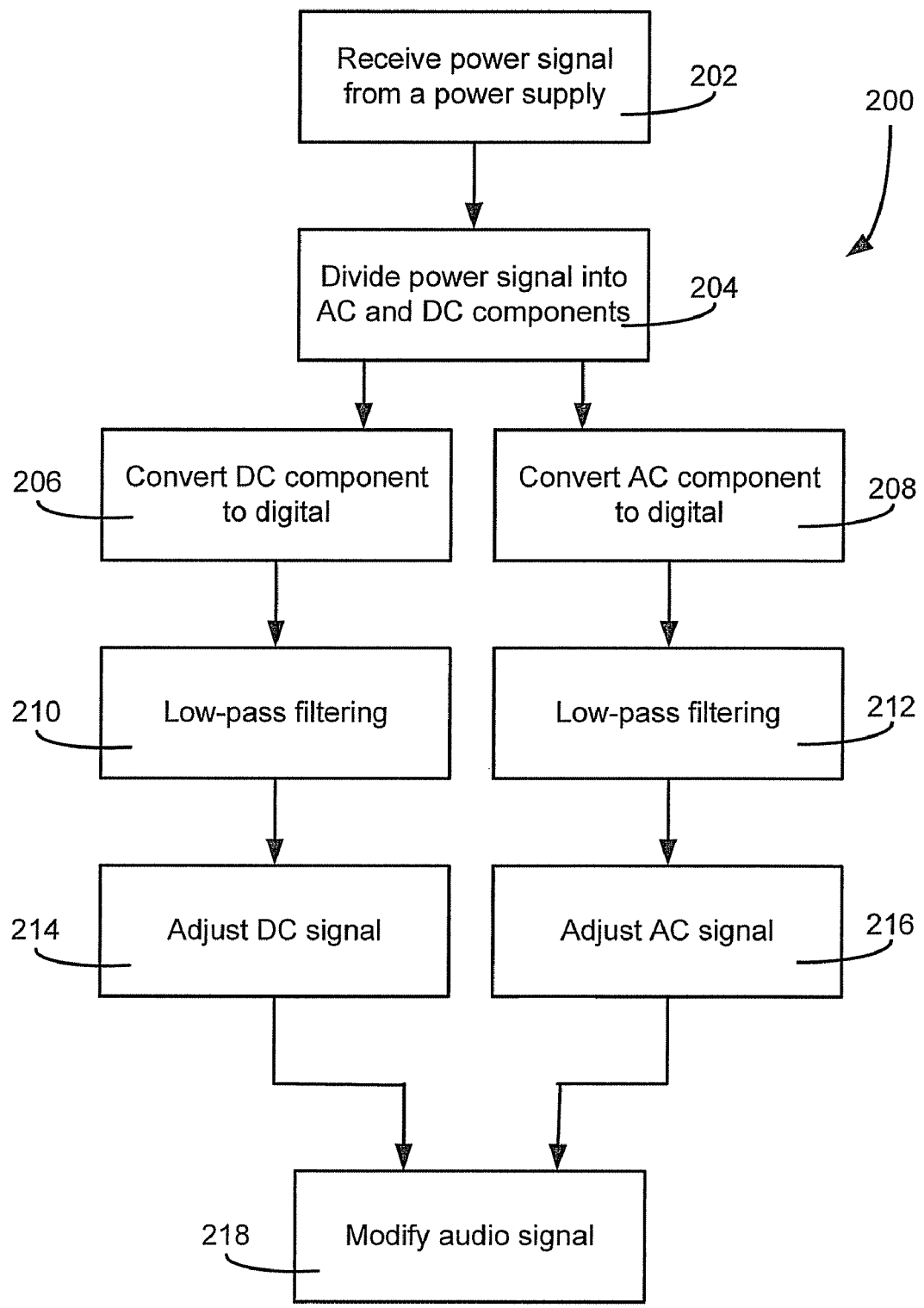
FIG. 2 is a flow chart depicting a particular illustrative embodiment of a method of processing an audio signal.

Referring to FIG. 2, a flow chart depicting a particular illustrative embodiment of a method of processing an audio signal is shown and generally designated 200. A power signal is received from a power supply, at 202. In a particular embodiment, the power supply can be an unregulated power supply. The power signal is divided into an analog alternating current (AC) component and an analog direct current (DC) component, at 204. In a particular embodiment, the power signal can be divided into the AC and DC components by a low-pass filter (LPF) and a high-pass filter (HPF) operating in parallel, such as the LPF 106 and the HPF 126 of FIG. 1. In another particular embodiment, the power signal can be divided into AC and DC components by a crossover element operating below an audio frequency range.

The analog DC component of the power signal is converted to a digital DC signal, at 206. The analog AC component of the power signal is converted to a digital AC signal, at 208. In a particular embodiment, the analog DC component can be converted to digital at a first analog-to-digital converter (ADC), such as the first ADC 110 of FIG. 1, and the analog AC component can be converted to digital at a second ADC, such as the second ADC 130 of FIG. 1. In another particular embodiment, the analog DC component and the analog AC component can each be converted to digital signals at a shared ADC having a multiplexed input.

In a particular embodiment, low-pass filtering is performed on the digital DC signal to generate a filtered digital DC signal, at 210. In a specific embodiment, the low-pass filtering of the digital DC signal can be performed by a LPF that operates below an audio frequency range. In a particular embodiment, low-pass filtering is performed on the digital AC signal to generate a filtered digital AC signal, at 212. In a specific embodiment, the low-pass filtering of the digital AC signal can be performed by a LPF that operates above the audio frequency range.

In a particular embodiment, the filtered digital DC signal is adjusted to generate an adjusted DC signal, at 214. In a specific embodiment, the filtered digital DC signal can be adjusted to indicate a deviation from a reference DC signal, such as the DC Normal input signal 120 of FIG. 1. In a particular embodiment, the filtered digital AC signal is adjusted to generate an adjusted AC signal, at 216. In a specific embodiment, the filtered digital AC signal can be adjusted based on a scaling factor to match a level of AC ripple relative to an audio signal.

An audio signal is modified based on at least the digital DC signal and the digital AC signal, at 218. In a particular embodiment, the audio signal can be modified based on the adjusted DC signal. In another particular embodiment, the audio signal can be modified based on the adjusted AC signal. In a specific embodiment, the audio signal can be modified to at least partially compensate for distortion due to errors of the power signal at a switching power stage that is coupled to the power supply.

Figure 3:
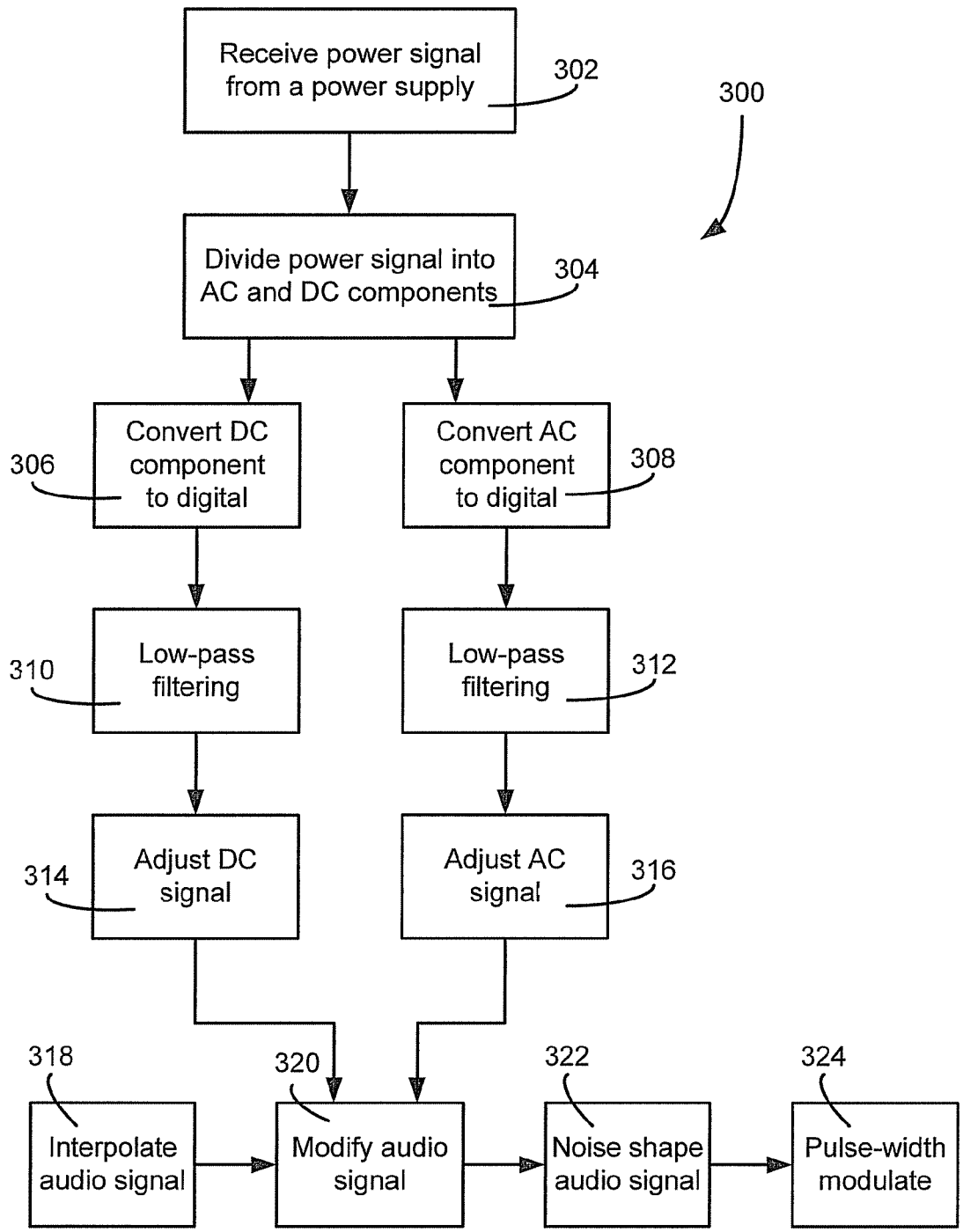
FIG. 3 is a flow chart depicting another illustrative embodiment of a method of processing an audio signal.

Referring to FIG. 3, a flow chart depicting another illustrative embodiment of a method of processing an audio signal is shown and generally designated 300. A power signal is received from a power supply, at 302. In a particular embodiment, the power supply can be an unregulated power supply. The power signal is divided into an analog alternating current (AC) component and an analog direct current (DC) component, at 304. In a particular embodiment, the power signal can be divided into the AC and DC components by a low-pass filter (LPF) and a high-pass filter (HPF) operating in parallel, such as the LPF 106 and the HPF 126 of FIG. 1. In another particular embodiment, the power signal can be divided into AC and DC components by a crossover element operating below an audio frequency range.

The analog DC component of the power signal is converted to a digital DC signal, at 306. The analog AC component of the power signal is converted to a digital AC signal, at 308. In a particular embodiment, the analog DC component can be converted to digital at a first analog-to-digital converter (ADC), such as the first ADC 110 of FIG. 1, and the analog AC component can be converted to digital at a second ADC, such as the second ADC 130 of FIG. 1. In another particular embodiment, the analog DC component and the analog AC component can each be converted to digital signals at a shared ADC having a multiplexed input.

In a particular embodiment, low-pass filtering is performed on the digital DC signal to generate a filtered digital DC signal, at 310. In a specific embodiment, the low-pass filtering of the digital DC signal can be performed by a LPF that operates to reject frequencies above approximately 20 Hz. In a particular embodiment, low-pass filtering is performed on the digital AC signal to generate a filtered digital AC signal, at 312. In a specific embodiment, the low-pass filtering of the digital AC signal can be performed by a LPF that operates to reject frequencies above approximately 100 kHz.

In a particular embodiment, the filtered digital DC signal is adjusted to generate an adjusted DC signal, at 314. In a specific embodiment, the filtered digital DC signal can be adjusted to indicate a deviation from a reference DC signal, such as the DC Normal input signal 120 of FIG. 1. In a particular embodiment, the filtered digital AC signal is adjusted to generate an adjusted AC signal, at 316. In a specific embodiment, the filtered digital AC signal can be adjusted based on a scaling factor to match a level of AC ripple relative to an audio signal.

In a particular embodiment, an audio signal is interpolated to generate an interpolated audio signal, at 318. In a particular embodiment, the interpolated audio signal is modified based on at least the adjusted digital DC signal and the adjusted digital AC signal to generate a modified audio signal, at 320. In a particular embodiment, the interpolated audio signal can be modified based on the adjusted DC signal. In another particular embodiment, the interpolated audio signal can be modified based on the adjusted AC signal. In a specific embodiment, the audio signal can be modified by both the adjusted DC signal and the adjusted AC signal to at least partially compensate for distortion from errors of the power signal at a switching power stage that is coupled to the power supply.

In a particular embodiment, the modified audio signal can be noise-shaped to generate a noise-shaped audio signal, at 322. In a particular embodiment, the noise-shaped audio signal can be pulse-width modulated to generate a pulse-width modulated audio signal, at 324. In a particular embodiment, a switching power stage can be driven with the pulse-width modulated audio signal. The switching power stage can include an output to provide a power output signal to a load.

While specific systems and components of systems have been shown, it should be understood that many alternatives are available for such systems and components. In a particular illustrative embodiment, for example, an audio signal processing system may include hardware, software, firmware, or any combination thereof to perform functions and methods of operation as described. It should be understood that particular embodiments may be practiced solely by a processor executing processor instructions and accessing a processor readable memory, or in combination with hardware, firmware, software, or any combination thereof.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be reduced. Accordingly, the disclosure and the figures are to be regarded as illustrative rather than restrictive.

Although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description. For example, although the system 100 of FIG. 1 depicts DC compensation logic 123 modifying an audio signal prior to AC compensation logic 144 modifying the audio signal, it will be understood that the DC compensation logic 123 and the AC compensation logic 144 can operate in any order to modify the audio signal, or can operate simultaneously. As another example, although the device 180 of FIG. 1 depicts a first ADC 110 and a second ADC 130, it will be understood that a single ADC having a multiplexed input can be used instead.

The Abstract of the Disclosure is provided to comply with 37 C.F.R. §1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments.

The above-disclosed subject matter is to be considered illustrative, and not restrictive, and the appended claims are intended to cover all such modifications, enhancements, and other embodiments which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An audio signal processing system for use in connection with a power supply of an audio amplifier, the system comprising:
    a first electrical path responsive to the power supply, the first electrical path comprising:
        a low pass filter coupled to the power supply to filter a direct current (DC) component of the power supply, the power supply to provide power to a power stage of the audio amplifier;
        a first analog-to-digital converter (ADC) responsive to an output of the low pass filter;
    a second electrical path responsive to the power supply, the second electrical path comprising:
        a high pass filter coupled to the power supply to filter an alternating current (AC) component of the power supply;
        a second ADC responsive to an output of the high pass filter; and
    compensation logic operable to modify an audio signal based on a first signal generated from the first electrical path and a second signal generated from the second electrical path.

2. The system of claim 1, wherein the first electrical path further comprises:
    a first digital low-pass filter coupled to an output of the first ADC;
    first adjustment logic operable to generate a first adjusted signal based on an output of the digital low-pass filter; and
    wherein the compensation logic modifies the audio signal based on the first adjusted signal.

3. The system of claim 2, wherein the first adjusted signal is generated based on combining a DC normal input with the output of the first digital low-pass filter.

4. The system of claim 3, wherein the DC normal input comprises a reference signal at least partially determined by a decibel (dB) level of correction for the power supply.

5. The system of claim 4, wherein the reference signal causes an attenuation to the audio signal.

6. The system of claim 4, wherein the reference signal causes a gain to be applied to the audio signal.

7. The system of claim 2, wherein the second electrical path further comprises:
    a second digital low-pass filter coupled to an output of the second ADC;
    second adjustment logic operable to generate an second adjusted signal based on an output of the second digital low-pass filter; and
    wherein the compensation logic modifies the audio signal based on the second adjusted signal.

8. The system of claim 7, wherein the second adjusted signal is generated based on multiplying a scaling value input with the output of the second digital low-pass filter.

9. The system of claim 1, further comprising:
a power stage to receive power from the power supply;
an interpolating circuit to interpolate the audio signal to produce an interpolated audio signal;
wherein the compensation logic includes first compensation logic, the first compensation logic is operable to modify the interpolated audio signal based on the first signal, the first compensation logic generating a first compensated audio signal;
wherein the compensation logic includes second compensation logic, the second compensation logic is operable to modify the first modified audio signal based on the second signal, the second compensation logic generating a second compensated audio signal;
a noise-shaping circuit to noise-shape the second compensated audio signal to produce a noise-shaped audio signal;
a pulse-width modulator to pulse-width modulate the noise-shaped audio signal to produce a pulse-width modulated audio signal; and
wherein the power stage is a switching power stage responsive to the pulse-width modulated signal.

10. The system of claim 9, wherein the switching power stage provides a power output signal to a load.

11. A method of processing an audio signal, the method comprising:
receiving a power signal from a power supply;
dividing the power signal into an analog direct current (DC) component and an analog alternating current (AC) component;
converting the analog DC component to a digital DC signal;
converting the analog AC component to a digital AC signal; and
modifying the audio signal based on at least the digital DC signal and the digital AC signal.

12. The method of claim 11, further comprising:
low-pass filtering the digital DC signal to generate a filtered digital DC signal;
adjusting the filtered digital DC signal to generate an adjusted DC signal; and
modifying the audio signal based on the adjusted DC signal.

13. The method of claim 11, further comprising:
low-pass filtering the digital AC signal to generate a filtered digital AC signal;
adjusting the filtered digital AC signal to generate an adjusted AC signal; and
modifying the audio signal based on the adjusted AC signal.

14. The method of claim 11, wherein dividing the power signal into the analog DC component and the analog AC component comprises passing the power signal through a low-pass filter to generate the analog DC component and passing the power signal through a high-pass filter in parallel with the low-pass filter, the high-pass filter generating the analog AC component.

15. The method of claim 11, further comprising:
low-pass filtering the digital DC signal to generate a filtered digital DC signal;
adjusting the filtered digital DC signal to generate an adjusted DC signal;
low-pass filtering the digital AC signal to generate a filtered digital AC signal;
adjusting the filtered digital AC signal to generate an adjusted AC signal; and
modifying the audio signal based on the adjusted AC signal and the adjusted DC signal.

16. The method of claim 15, further comprising:
interpolating the audio signal to generate an interpolated audio signal;
modifying the interpolated audio signal based on at least the digital DC signal and the digital AC signal to generate a modified audio signal;
noise-shaping the modified audio signal to generate a noise-shaped audio signal;
pulse-width modulating the noise-shaped audio signal to generate a pulse-width modulated audio signal; and
driving a switching power stage with the pulse-width audio modulated signal, the switching power stage including an output to provide a power output signal to a load.

17. An audio amplifying device, comprising:
a power stage having a power supply input;
a low pass filter coupled to the power supply input to generate a direct current (DC) component of the power supply input;
a high pass filter coupled to the power supply input to generate an alternating current (AC) component of the power supply input;
a first analog-to-digital converter (ADC) coupled to an output of the low pass filter;
a second ADC coupled to an output of the high pass filter;
first logic coupled to an output of the first ADC and operable to modify an audio signal based on the output of the first ADC to generate a first compensated signal; and
second logic coupled to an output of the second ADC and operable to modify the first compensated signal based on the output of the second ADC.

18. The audio amplifying device of claim 17, wherein the power stage is a switching power stage.

19. The audio amplifying device of claim 18, further comprising a pulse-width modulator coupled to an input of the switching power stage.

20. The audio amplifying device of claim 19, further comprising:
an interpolating circuit for interpolating the audio signal to produce an interpolated signal;
wherein the first and second logic modify the interpolated signal to produce a modified signal;
a noise-shaping circuit for noise-shaping the modified signal to produce a noise-shaped signal; and
wherein the noise-shaped signal is input to the pulse-width modulator.

21. The audio amplifying device of claim 17, further comprising:
a first digital low-pass filter coupled to the output of the first ADC;
third logic operable to generate a first adjusted signal based on an output of the first digital low-pass filter; and
wherein the first logic is operable to modify the audio signal based on the first adjusted signal.

22. The audio amplifying device of claim 21, further comprising:
a second digital low-pass filter coupled to the output of the second ADC.

23. A method comprising:
receiving a power supply signal from a power supply of a power amplifier;
filtering the power supply signal into an analog direct current (DC) signal and an analog alternating current (AC) signal;
converting the analog DC signal to a digital DC signal;

converting the analog AC signal to a digital AC signal;
adjusting an audio signal based on at least the digital DC signal and the digital AC signal to generate an adjusted audio signal;
pulse-width modulating the adjusted audio signal to produce a pulse-width modulated audio signal; and
driving a switching power stage with the pulse-width modulated signal.

24. The method of claim 23, wherein filtering the power supply signal into the analog DC signal and the analog AC signal comprises passing the power supply signal through a low-pass filter to generate the analog DC signal and passing the power supply signal through a high-pass filter in parallel with the low-pass filter, the high-pass filter generating the analog AC signal.

* * * * *